(12) United States Patent
Kim

(10) Patent No.: US 6,835,585 B2
(45) Date of Patent: Dec. 28, 2004

(54) METHOD OF FABRICATING ELECTRO-ABSORPTION MODULATOR INTEGRATED LASER

(75) Inventor: Nam-Heon Kim, Suwon-shi (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 450 days.

(21) Appl. No.: 09/854,653

(22) Filed: May 14, 2001

(65) Prior Publication Data

US 2002/0004255 A1 Jan. 10, 2002

(30) Foreign Application Priority Data

Jul. 4, 2000 (KR) ........................................ 2000-37961

(51) Int. Cl.$^7$ .............................................. H01L 21/00
(52) U.S. Cl. ........................................................ 438/47
(58) Field of Search ..................................... 438/46, 47

(56) References Cited

U.S. PATENT DOCUMENTS 4,905,253 A * 2/1990 Chraplyvy et al. ............ 372/96
6,455,338 B1 * 9/2002 Takagi et al. .................. 438/24

* cited by examiner

Primary Examiner—W. David Coleman
(74) Attorney, Agent, or Firm—Cha & Reiter, LLC

(57) ABSTRACT

There is provided an EML (an electro-absorption modulator integrated laser) fabricating method for optical communication in which a compound semiconductor structure with a laser diode directly combined with a modulator is prepared simultaneously, a two step InP layer is formed on the compound semiconductor structure, an InGaAs layer is formed on the InP layer, a mask layer is formed in a trench between the laser diode and the modulator, Zn or a Zn compound is deposited in a metal contact forming area on the laser diode and the modulator except for the trench and diffusing the Zn, and the mask layer and InGaAs layer are selectively etched to a predetermined depth.

12 Claims, 4 Drawing Sheets

METHOD OF FABRICATING ELECTRO-ABSORPTION MODULATOR INTEGRATED LASER

CLAIM OF PRIORITY

This application claims priority to an application entitled "Method of Fabricating Electro-Absorption Modulator Integrated Laser" filed in the Korean Industrial Property Office on Jul. 4, 2000 and there duly assigned Serial No. 2000-37961.

BACKGROUND OF THE INVENTION

1. Field of the Invention

The present invention relates generally to a laser diode for optical transmission, and in particular, to a method of fabricating an electro-absorption-modulator-integrated-laser (EML) having a laser diode and a modulator for an ultra high-speed optical communication network.

2. Description of the Related Art

In the field of transmitter devices for optical communications, the integration of a laser diode with a modulator in a buried heterostructure is used to provide a simple light transmission circuit at a low cost and less chirp. This device is used for transmitting digital signals through an optical fiber at a high speed in a wide range. Typically, an ultra high-speed optical transmission network requires a transmission speed of 2.5 gigabit per second (Gbps) or higher. To this end, a single-mode laser (e.g. a Distributed FeedBack laser) is used as a light source and an electro-absorption modulator is used as a switch. Signals resulting from applying a current to the active layer of the DFB (Distributed FeedBack) laser diode may be directly modulated to reach the higher frequency band. However, a direct modulation has a limited transmission distance because of chirp. To solve the transmission limit, external modulation using an electro-absorption (EA) light modulator may be employed for long distance fiber optic communication over several tens to several hundreds of kilometers or more at a high speed of 2.5-10 gigabit per second (Gb/s) or higher. One way to achieve this type of high-speed transmission is utilizing an electro-absorption-modulator-integrated-laser (EML). The use of EML has advantages in obtaining relatively small optical loss during modulation. The EML also allows a compact module due to the integrated structure and requires a low driving voltage.

Since a semiconductor laser part is a forward bias device and a modulator part is a reverse bias device, the characteristics of an EML are determined by isolation between these two devices. As shown in FIG. 1, the conventional EML is fabricated by electrically isolating the laser diode region 11 from a modulator region 12 through either the isolation etching or ion implantation process. In the isolation etching, an isolation region is formed between the DFB laser diode and the EA modulator by etching away both the cap and the middle of cladding. Here, the resistance between two devices varies according to the amount of etching. Thus, the isolation etching process should be controlled accurately. In the ion implantation process, the electrical isolation can be achieved without etching away the cap and cladding layers, by using deep ion implantation in the region between the laser diode and the modulator. However, it takes a long time to find out an optimal condition for the ion implantation, and it is also difficult to maintain the optimal condition due to adverse effect by the ion implantation on the grown crystals.

SUMMARY OF THE INVENTION

It is, therefore, an object of the present invention to provide an EML fabricating method that obviates the need for a separate isolation etching control requirement and the ion implantation process.

To achieve the above object, an EML is fabricated by the following steps: preparing a compound semiconductor structure in which a laser diode is directly integrated with a modulator simultaneously; forming a two step InP layer, comprised of p-Inp and undoped InP layers, on the compound semiconductor structure, forming an InGaAs layer on the undoped InP layer; forming a mask layer defining a trench region between the laser diode and the modulator regions; depositing Zn or a Zn compound in a metal contact forming area on the laser diode and the modulator regions, except for the trench area; diffusing the Zn; and, selectively etching the mask layer and the InGaAs layer to a predetermined depth.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. For the purpose of clarity, well-known functions or constructions are not described in detail as they would obscure the invention in unnecessary detail.

Figure 1:
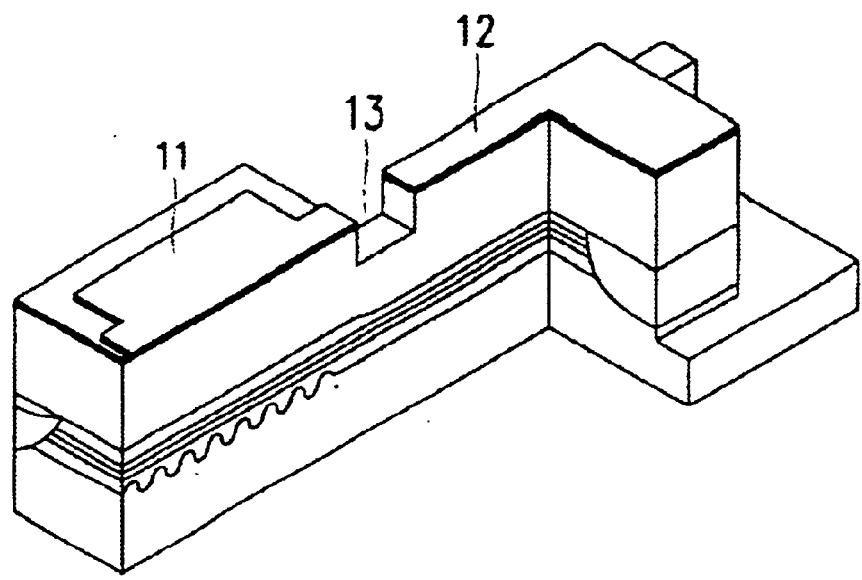
FIG. 1 illustrates a conventional electro-absorption-modulator-integrated-laser (EML)
Figure 2:
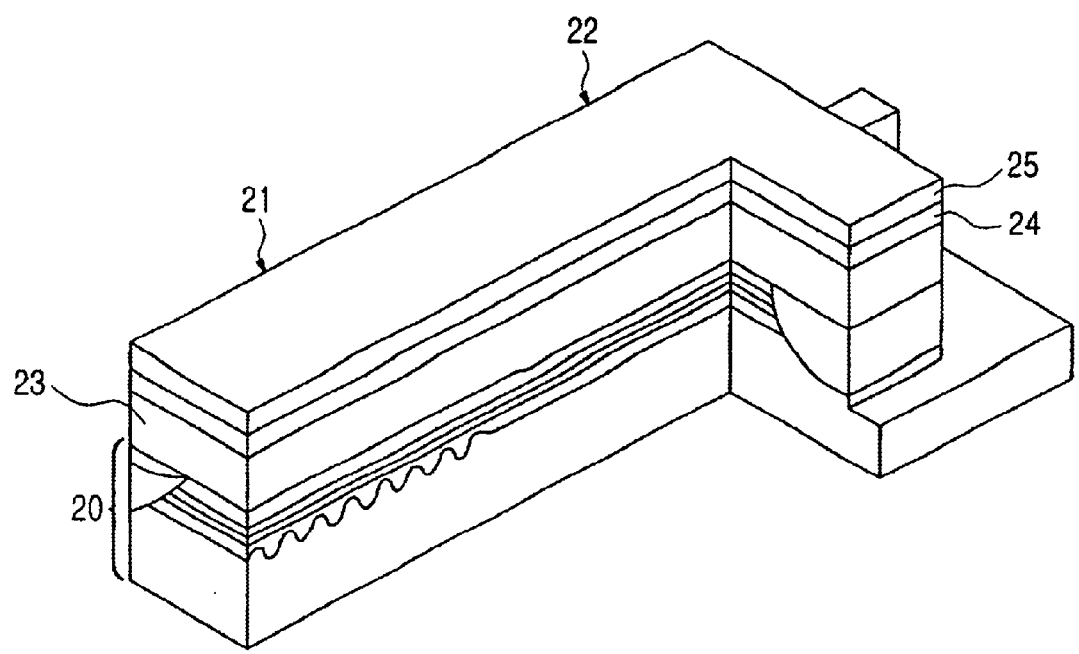
FIGS. 2 and 3 are views illustrating the EML fabricating method according to the present invention; and, FIG. 4 illustrates an EML fabricated according to the present invention.
Figure 3:
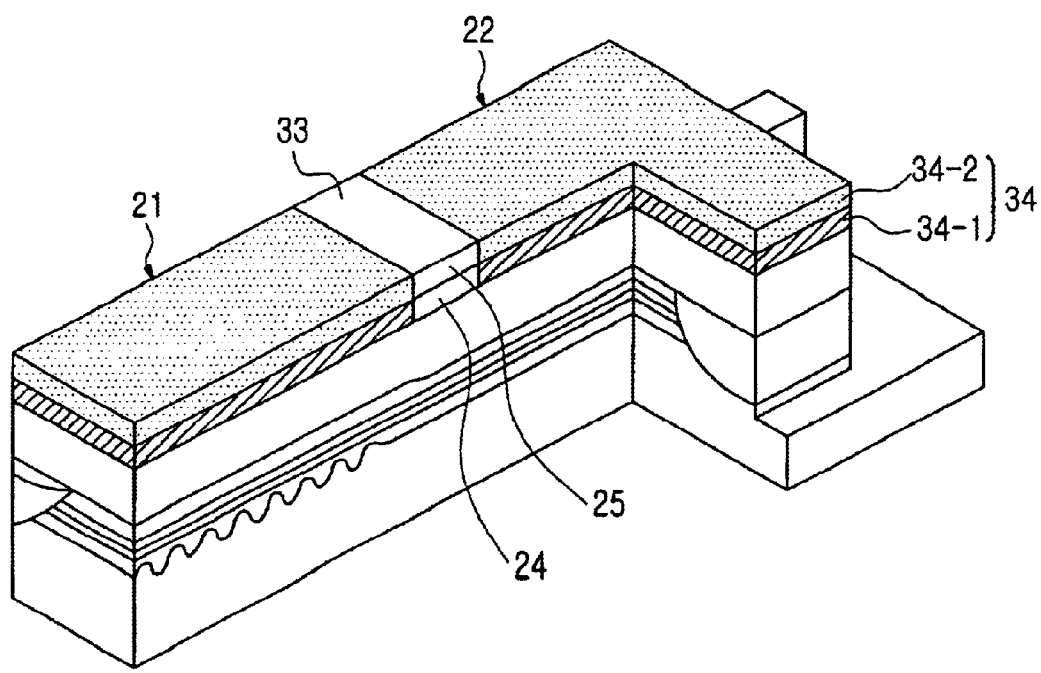
Figure 4:
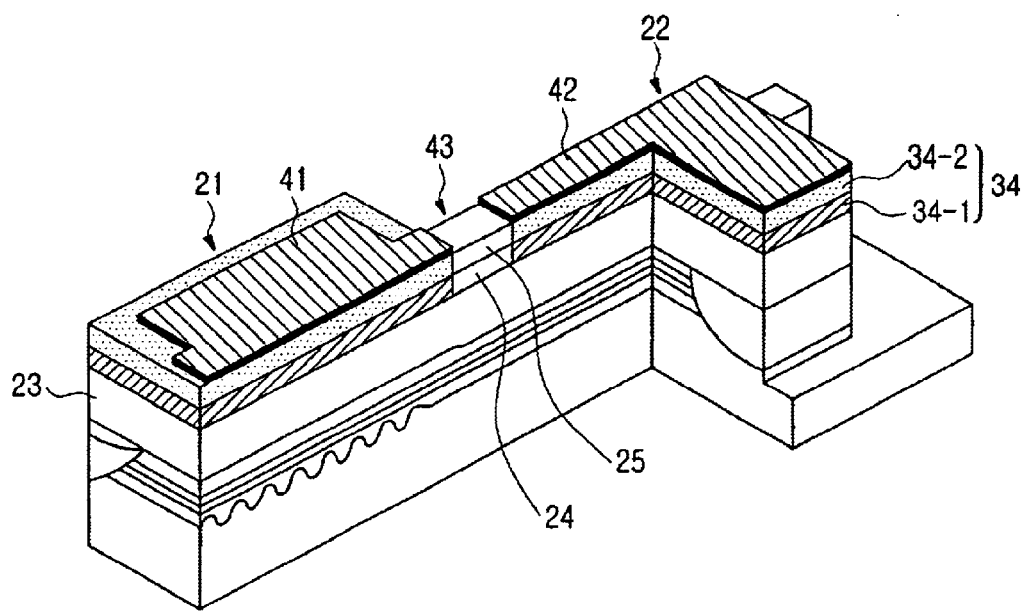

FIGS. 2 and 3 are graphical views illustrating the method of fabricating EML according to the present invention, whereas FIG. 4 illustrates the resultant EML fabricated according to the present invention.

In order to fabricate an EML according to the present invention, a laser diode region 21 and a modulator region 22 are grown in a buried-heterostructure simultaneously. Referring to FIG. 2, the integrated EML is initially fabricated on a wafer grown from an $n^{++}$-InP substrate 20 on which are grown a number of layers, including a p doped InP clad layer 23 and an undoped InP layer 24. The undoped InP layer 24 is capped by an InGaAs cap layer 25. That is to say, the InP layer 24 is grown on top of a predetermined region of the p-type clad layer 23 without impurity doping, and the InGaAs cap layer 25 is grown on top of the InP layer 24 without impurity doping. Here, the InGaAs cap layer 25 has a relatively low resistance, thus serves as a contact layer to which electrical contacts may be made.

Thereafter, as shown in FIG. 3, a mask layer 33 is arranged on and defines a trench region (or isolation region 43. shown in FIG. 4) is formed in strips, between a laser diode region 21 and a modulator region 22 with a material that prevents Zn diffusion, such as $SiO_2$ or SiNx. The mask layer 33 is provided to prevent the diffusion of Zn in the trench region.

Referring again to FIG. 3, one of Zn-diffusing materials selected from ZnO, $Zn_3As_2$, and $Zn_3P_2$ is then deposited in the remaining laser diode 21 and modulator 22 regions to form Zn-diffusing layer 34, comprised of p-InP layer 34-1 and p-InGaAs layer 34-2. Then, the whole structure shown in FIG. 3 is heated at a predetermined temperature, so that Zn of the Zn compound can be introduced into the InGaAs cap layer 25. It is preferable to induce the Zn diffusion at a Zn diffusion facilitating temperature range, for example, at 500 to 600° C. It is preferable that Zn is doped at a concentration of $10^{19}$ cm$^{-3}$ to achieve an ohmic contact characteristic. In addition, the doping concentration after Zn diffusion was set to be $3\times10^{19}$ to $4\times10^{19}$ cm$^{-3}$, thus exhibiting excellent contact characteristics.

As a result of Zn diffusion, the undoped InP layer 24 and the InGaAs cap layer 25 are doped to a p-type. Alternatively, it is also possible to diffuse Zn by loading a Zn material into an ampoule. Furthermore, the undoped InP layer 24 and the InGaAs cap layer 25 can be deposited by MOCVD (Metal Organic Chemical Vapor Deposition) or molecular ray epitaxy. After the diffusion, the mask layer 33 is removed.

In the above step, Zn is diffused into the overall surface of the resultant structure except for the trench region covered by the mask layer 33. As a consequence, the Zn-diffused regions 31 and 32 can function as a clad layer and a capping layer, respectively.

Next, referring to FIG. 4, the InGaAs cap layer in the trench region 43, which was covered by the mask layer 33 (shown in FIG. 3), is etched to a predetermined depth for isolation. The InGaAs cap layer 25 and the undoped InP layer 24 underneath the trench region 43 are not doped with an impurity and thus experience no Zn diffusion. Despite the etching of the InGaAs cap layer underneath the trench region 43 to a predetermined depth, the remaining InGaAs cap layer 25 electrically isolates the laser diode region 21 from the modulator region 22. Finally, a metal contact Layer 41 and 42, e.g., Au, is formed on top of the respective laser diode 21 and the modulator 22 regions. Thus, the fabrication of EML is completed.

In summary, an InP layer and an InGaAs layer are formed on a compound semiconductor structure so that a laser diode is directly combined with a modulator. To achieve this, a Zn compound is deposited in the laser diode and the modulator area, except for the trench region defining the isolation area between the laser diode and the modulator. Then, Zn is diffused and the InGaAs cap layer underneath the trench region is selectively etched. Accordingly, an EML can be fabricated without ion implantation or an isolation etching control requirement.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of fabricating an electro-absorption modulator-integrated laser (EML) for optical communication, comprising the steps of:
    preparing a compound semiconductor structure having a laser diode section and a modulator section growing simultaneously;
    forming a two step InP layer, a bottom layer consisting of a P-InP layer and a top layer consisting of an undoped InP layer, on the top surface of the compound semiconductor structure;
    forming an InGaAs layer which selectively covers the top surface of the undoped InP layer,
    forming a mask layer in strips which selectively covers the top surface of the InGaAs layer, defining a trench region between the laser diode section and the modulator section;
    depositing Zn or a Zn compound on the top surface of the laser diode section and the modulator section except for the trench region and diffusing the Zn; and,
    selectively etching the mask layer and the InGaAs layer to a predetermined depth such that a remaining layer of InGaAs electrically isolates the laser diode section from the modulator section.

2. The method of claim 1, wherein the mask layer is formed by one of SiO$_2$ and SiNx to prevent Zn diffusion.

3. The method of claim 1, wherein Zn diffusion is performed in a Zn diffusion facilitating temperature range.

4. The method of claim 2, wherein Zn diffusion is performed in a Zn diffusion facilitating temperature range.

5. The method of claim 1, wherein the Zn compound is one of ZnO, Zn$_3$As$_2$, and Zn$_3$P$_2$.

6. The method of claim 1, further comprising the step of forming a metal layer on the top of the laser diode section and the modulator section after the etching step.

7. The method of claim 1, further comprising the step of removing the mask layer after the diffusion step.

8. A method for fabricating an electro-absorption modulator-integrated laser (EML) for optical communication, comprising the steps of:
    simultaneously forming a laser diode section and a modulator section which selectively cover a planar surface of a semiconductor substrate;
    forming an InP layer composed of a bottom layer consisting of a p-InP layer and a top layer consisting of a undoped InP layer on said planar surface;
    forming an InGaAs layer covering the top surface of said undoped InP layer;
    forming a mask layer in strips, between said laser diode section and said modulator section, on the top surface of said InGaAs layer;
    forming a Zn compound layer on the top surface of said undoped InP layer not covering said mask layer;
    removing said mask layer after diffusing the Zn compound layer; and,
    etching said InGaAs layer covered by said mask layer to a predetermined depth.

9. The method of claim 8, wherein said mask layer is formed by one of SiO$_2$ and SiNx to prevent Zn diffusion.

10. The method of claim 8, wherein Zn diffusion is performed in a Zn diffusion facilitating temperature range.

11. The method of claim 8, wherein said Zn compound is one of ZnO, Zn$_3$AS$_2$, and Zn$_3$P$_2$.

12. The method of claim 8, further comprising the step of forming a metal layer on the top surface of said laser diode section and said modulator section after the etching step.

* * * * *